(12) United States Patent
Jain et al.

(10) Patent No.: US 9,183,338 B1
(45) Date of Patent: Nov. 10, 2015

(54) SINGLE-EVENT UPSET MITIGATION IN CIRCUIT DESIGN FOR PROGRAMMABLE INTEGRATED CIRCUITS

(71) Applicant: Xilinx, Inc., San Jose, CA (US)

(72) Inventors: Praful Jain, Los Gatos, CA (US); Pierre Maillard, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/487,286

(22) Filed: Sep. 16, 2014

(51) Int. Cl.
*G06F 17/50* (2006.01)

(52) U.S. Cl.
CPC .......... *G06F 17/505* (2013.01); *G06F 17/5054* (2013.01)

(58) Field of Classification Search
USPC .................. 716/104, 106, 111, 116
See application file for complete search history.

(56) References Cited

U.S. PATENT DOCUMENTS

| 7,111,215 | B1 * | 9/2006 | Keller et al. ................... 714/725 |
| 7,310,759 | B1 * | 12/2007 | Carmichael et al. .......... 714/725 |
| 7,426,678 | B1 * | 9/2008 | Cory et al. ..................... 714/785 |
| 8,065,644 | B1 * | 11/2011 | Jacobson et al. .............. 716/112 |
| 8,146,028 | B1 * | 3/2012 | Lesea ............................. 716/104 |
| 2004/0230935 | A1 * | 11/2004 | Samudrala et al. ............. 716/17 |

* cited by examiner

*Primary Examiner* — Brian Ngo
(74) *Attorney, Agent, or Firm* — Robert Brush (57) ABSTRACT

In an example, a method of implementing a circuit design for a programmable integrated circuit (IC) begins by identifying combinatorial logic functions of the circuit design. The method maps, according to a first constraint, a first threshold percentage of the combinatorial logic functions onto a first type of lookup tables (LUTs) of the programmable IC in favor of second type of LUTs of the programmable IC, the second type of LUTs being more susceptible to single event upsets than the first type of LUTs. The method generates a first physical implementation of the circuit design for the programmable IC based on the mapping.

20 Claims, 6 Drawing Sheets

SINGLE-EVENT UPSET MITIGATION IN CIRCUIT DESIGN FOR PROGRAMMABLE INTEGRATED CIRCUITS

TECHNICAL FIELD

Examples of the present disclosure generally relate to electronic circuit design and, in particular, to mitigating single-event upsets in circuit designs implemented for programmable integrated circuits.

BACKGROUND

Circuit designs for integrated circuits (ICs) can be generated using a variety of techniques. In some examples, designers can write register-transfer level (RTL) code, write program-language code, create schematic representations, or a combination thereof to design a circuit for implementation in a target IC device. The target IC device can be a programmable IC, such as a field programmable gate array (FPGA), a mask-programmable IC, such as an application specific integrated circuit (ASIC), or the like. In the design flow, a designer creates a description of the circuit design, which is then processed through one or more steps that transform the description into a physical implementation of the circuit design for a target IC device.

Programmable ICs, such as FPGAs, typically include programmable logic that can be configured by loading configuration data into configuration memory cells. In FPGAs, for example, each configuration memory cell comprises a static random access memory (RAM) cell. A configuration memory cell can exhibit an unintentional change in state when the programmable IC is subjected to radiation, such as cosmic rays, bombardment by neutrons or alpha particles, or the like. For example, a stored logic high value can be inadvertently changed to a logic low value and vice versa. Such "single-event upsets" can alter the functionality of a circuit configured in the programmable IC, which can cause the circuit to fail. The rate of failure of a circuit due to single-event upsets is referred to as the single-event failure rate or "SER."

SUMMARY

Techniques for mitigating single-event upsets (SEUs) in circuit designs implemented for programmable integrated circuits (ICs) are described. In an example, a method of implementing a circuit design for a programmable IC begins by identifying combinatorial logic functions of the circuit design. The method maps, according to a first constraint, a first threshold percentage of the combinatorial logic functions onto a first type of lookup tables (LUTs) of the programmable IC in favor of second type of LUTs of the programmable IC, the second type of LUTs being more susceptible to single event upsets than the first type of LUTs. The method generates a first physical implementation of the circuit design for the programmable IC based on the mapping.

In another example, a non-transitory computer readable medium comprises instructions, which when executed in a computer system, causes the computer system to carry out a method of implementing a circuit design for a programmable IC. The method identifies combinatorial logic functions of the circuit design. The method maps, according to a first constraint, a first threshold percentage of the combinatorial logic functions onto a first type of LUTs of the programmable IC in favor of second type of LUTs of the programmable IC, the second type of LUTs being more susceptible to single event upsets than the first type of LUTs. The method generates a first physical implementation of the circuit design for the programmable IC based on the mapping.

In another example, a computer system includes a circuit design tool executing therein programmed to implement a circuit design for a programmable IC. The computer system includes a memory and a process. The memory is coupled to store descriptions of the circuit design. The processor is coupled to the memory and is programmed to identify combinatorial logic functions of the circuit design, map, according to a first constraint, a first threshold percentage of the combinatorial logic functions onto a first type of LUTs of the programmable IC in favor of second type of LUTs of the programmable IC, the second type of LUTs being more susceptible to single event upsets than the first type of LUTs, and generate a first physical implementation of the circuit design for the programmable IC based on the mapping.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Techniques for mitigating single-event upsets (SEUs) in circuit designs implemented for programmable integrated circuits (ICs) are described. Single-event upset effects are a concern, particularly in sub-100 nanometer (nm) technologies, due to reduction of capacitance at storage nodes of memory cells. Programmable ICs, such as field programmable gate arrays (FPGAs), include a large number of memory cells used to configure programmable logic. Some logic elements are associated with configuration memory cells that are larger in terms of implementation area than configuration memory cells for other logic elements. Larger configuration memory cells are more susceptible to SEUs than smaller configuration memory cells. Accordingly, techniques described herein generally utilize constraints during implementation of a circuit design for a programmable IC that prefer the use of logic elements associated with smaller configuration memory cells where possible.

For example, programmable ICs, such as FPGAs, can include a large number of configurable logic blocks (CLBs) having lookup tables (LUTs). Each LUT has a "combinatorial mode" that can be used to implement combinatorial logic functions. Some specialized LUTs can have an additional mode, referred to herein as the "storage mode," that can be used to implement a memory (e.g., random access memory (RAM), shift register memory, etc.). These specialized LUTs are referred to herein as "LUTRAMs" or "LUTRAM-type lookup tables" to distinguish them from LUTs having only the combinatorial mode, which are referred to as "LUT-type lookup tables." The term "LUT" without a modifier encompasses both LUTRAM-type lookup tables and LUT-type lookup tables. For LUTRAMs, the associated configuration memory cells have additional pass-gate transistors to accommodate the storage mode. The additional pass-gate transistors increase the implementation area of these configuration memory cells, causing the LUTRAMs to be more susceptible to SEUs.

Accordingly, in some examples, a circuit design tool preferentially realizes combinatorial logic functions of a circuit design using LUT-type lookup tables in favor of LUTRAM-type lookup tables during implementation of the circuit design for a programmable IC. That is, the circuit design tool preferentially avoids realizing combinatorial logic functions using LUTRAMs in combinatorial mode. The preference can be overridden in cases where the use of LUTRAM-type lookup tables is necessary (e.g., to meet timing and/or power implementation constraints). Increasing the use percentage of LUT-type lookup tables with respect to LUTRAM-type lookup tables can reduce the failure rate of the circuit design due to SEUs. These and further aspects of the present disclosure are discussed below.

Figure 1:
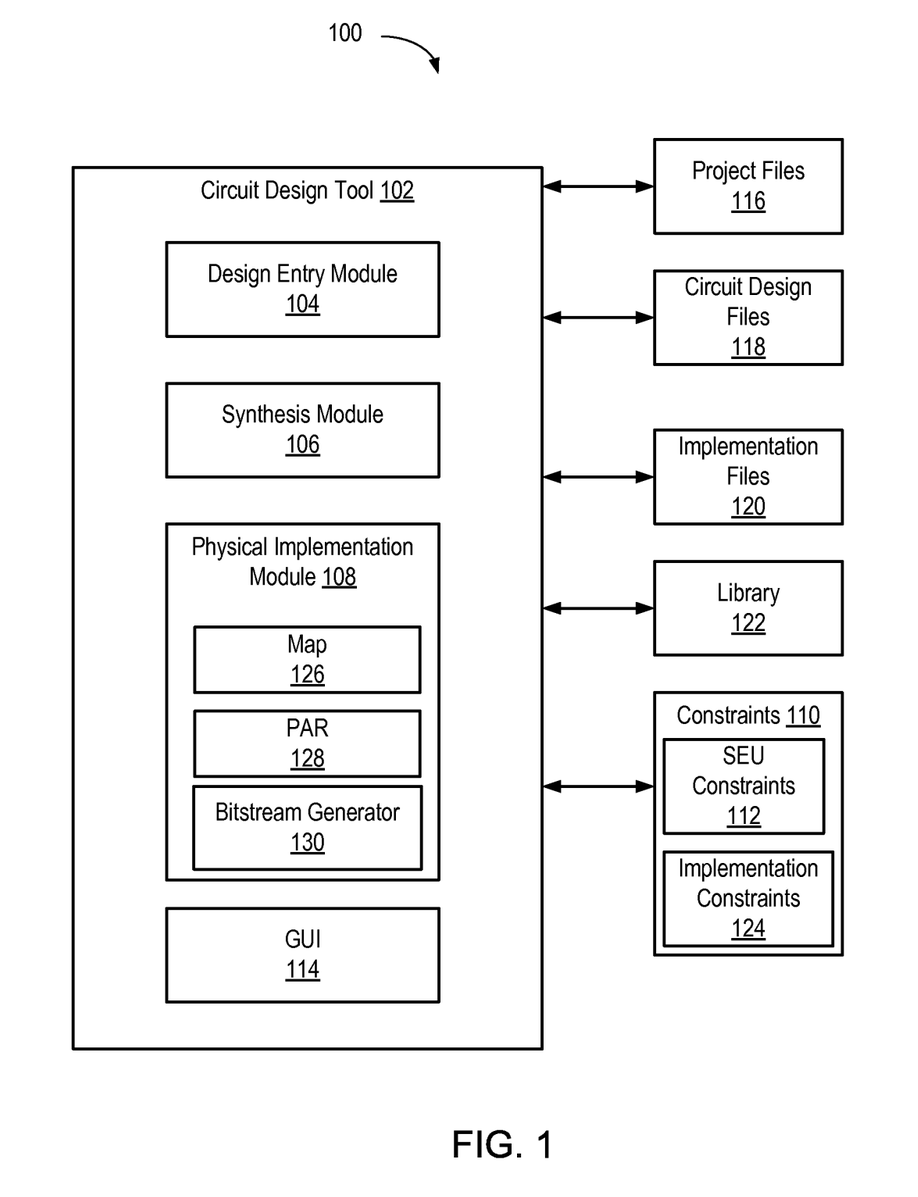
FIG. 1 is a block diagram depicting an example circuit design system.

Turning now to the figures, FIG. 1 is a block diagram depicting an example circuit design system 100. The circuit design system 100 includes a circuit design tool 102 having a design entry module 104, a synthesis module 106, a physical implementation module 108, and a graphical user interface (GUI) 114. The circuit design tool 102 can be implemented by circuitry that is part of an electronic system, by firmware in the electronic system, by software in the electronic system, or by a combination thereof. An example electronic system in which the circuit design system 100 can be implemented is described below with respect to FIG. 6.

In general, the circuit design system 100 generates an abstract description of the circuit design, which is processed into a physical description of the circuit design for a particular target programmable IC. The circuit design system 100 can process the abstract description of the circuit design through various intermediate transformations to produce the physical description of the circuit design for a target programmable IC. The physical description of the circuit design can be formatted and loaded into a programmable IC to produce a physical circuit. Thus, the circuit design system 100 transforms an abstract representation of the circuit design (the abstract description) into a physical representation of the circuit design (the physical description) that can be formatted to realize a physical circuit in a programmable IC.

A user interacts with the circuit design tool 102 to produce project files 116, circuit design files 118, and implementation files 120. The project files 116 include one or more files specifying project settings for each circuit design. For example, the project files 116 can specify attributes for target hardware of a circuit design, such as a type of programmable IC in the target hardware, a model of the programmable IC, a speed grade of the programmable IC, a number of IO ports of the programmable IC, and the like. The circuit design files 118 include one or more files specifying each circuit design at various levels of abstraction, such as a high-level block model of the circuit design, a lower level hardware description language (HDL) model of the circuit design, or the like. In general, the circuit design files 118 have little or no dependence on the target programmable IC. The circuit design tool 102 processes the circuit design files 118 to generate the implementation files 120. The implementation files 120 include one or more files specifying each circuit design with varying dependence of the target programmable IC. For example, the implementation files 120 can include a netlist synthesized into technology specific elements for a target programmable IC (e.g., a netlist mapped, placed, and routed for a programmable IC).

The design entry module 104 generates a functional description of the circuit design in response to user input through the GUI 114. The functional description can include descriptions for a plurality of circuit components, such as flip-flops, memories, logic gates, processors, and the like, coupled together by connections (referred to as "nets" or "signals"). The functional description can include a register transfer level (RTL) description specified using a circuit design language (e.g., a hardware description language (HDL)) and/or specified schematically. The functional description can include a high-level model description specified using a program language, such as C, C++, JAVA, or the like, and/or specified schematically. The functional description can include a combination of RTL and high-level model descriptions. The GUI 114 can include a graphic interface through which an end user connects symbols and blocks representing various components to produce a schematic of the circuit design. The GUI 114 can include a text interface through which a user writes HDL/program language code. The GUI 114 can employ a combination of schematic and text-based entry. In some examples, the design entry module 104 can access a library 122 having a plurality of circuit components, such as intellectual property (IP) cores and the like. The functional description can be stored in one or more of the circuit design files 118.

The synthesis module 106 produces a logical implementation of the circuit design from the functional description. The logical implementation of the circuit design includes a logical representation of the circuit design in terms of specific logic elements. For example, the synthesis module 106 can perform "technology mapping" that transforms generic circuit elements into technology-specific circuit elements. For example, the logical implementation can include a representation of the circuit design in terms of specific logic elements optimized to the architecture of a programmable IC, such as lookup tables (LUTs), carry logic, IO buffers, and like technology-specific components. In another example, the logical implementation can include a representation of the circuit design in terms of logic gates, flip-flops, and the like. In an example, the logical implementation includes a logical network list ("netlist") supported by a programmable IC of the target hardware. The logical implementation can be stored in one or more of the implementation files 120.

The physical implementation module 108 produces a physical implementation of the circuit design from the logical implementation. The physical implementation of the circuit design is a physical representation of the circuit design for implementation in a target programmable IC. For example, the physical implementation module 108 can include a map module 126, a place-and-route (PAR) module 128, and a bitstream generator 130. The map module 216 maps the logic elements in the logical implementation onto primitive components within the target programmable IC. The PAR module 128 places the mapped primitive components within the target programmable IC and routes interconnects between the placed primitive components. The bitstream generator 130 generates a configuration bitstream for implementing the circuit design in a target programmable IC. The physical implementation can be stored in one or more of the implementation files 120.

The circuit design tool 102 is also responsive to constraints 110 on implementation of the circuit design. A user can select the constraints 110 to be applied during implementation of the circuit design. The circuit design tool 102 can also provide default constraints (e.g., in constraints 110) absent user selection thereof. The constraints 110 can include SEU constraints 112. The SEU constraints 112 constrain the mapping of combinatorial logic functions to LUTs such that, if a combinatorial logic function needs to be realized in the target programmable IC, the combinatorial logic function is preferentially realized using a LUT-type lookup table rather than a LUTRAM-type lookup table. The strength of the preference can vary between realizing all combinatorial logic functions using LUT-type lookup tables and realizing some combinatorial logic functions using LUT-type lookup tables. As discussed below, the preference for realizing particular combinatorial logic function(s) using LUT-type lookup tables can be overcome based on results of the physical implementation process. The effect of the SEU constraints 112 is to increase the percentage of LUT-type lookup tables used to implement combinatorial logic functions with respect to LUTRAM-type lookup tables. While LUTRAM-type lookup tables are capable of implementing combinatorial logic functions, using a higher percentage of LUT-type lookup tables mitigates SEU effects.

The SEU constraints 112 can include synthesis constraints for use by the synthesis module 106. The synthesis module 106 can map combinatorial logic functions to LUTs based on the defined preference for LUT-type lookup tables. Thus, the logical implementation generated by the synthesis module 106 can include information on which types of LUTs are to be used during physical implementation. In another example, the SEU constraints 112 can include implementation constraints for use by the physical implementation module 108. For example, the map module 126 can select primitive components having LUT-type lookup tables for combinatorial logic functions based on the defined preference. In another example, the PAR module 128 can place combinatorial logic of the circuit design to use LUT-type lookup tables based on the defined preference.

The preference for realizing combinatorial logic functions using LUT-type lookup tables can be implemented, for example, by mapping a threshold percentage of the combinatorial logic functions onto LUT-type lookup tables. In some examples, the threshold percentage can be 100% such that all combinatorial logic functions are realized using LUT-type lookup tables. In such a case, the LUTRAM-type lookup tables would only be used when implementing logic elements requiring the storage mode (e.g., RAM or shift register elements), if any. This provides the largest reduction in SEU error rate for the circuit design. In other examples, the threshold percentage can be less than 100% such that some combinatorial logic functions are allowed to be realized using LUTRAM-type lookup tables. For some circuit designs, use of only LUT-type lookup tables for combinatorial logic functions may not be practical or possible. In some examples, the threshold percentage can vary depending on the circuit design (e.g., the threshold percentage is lower for larger circuit designs and higher for smaller circuit designs). In some examples, the threshold percentage can be set by the user. If the threshold percentage cannot be achieved, the circuit design system 100 can automatically lower the threshold percentage or indicate the need for a lower threshold percentage to the user.

The preference for using LUT-type lookup tables to realize one or more specific combinatorial logic functions can be overcome based on feedback from the physical implementation module 108 during physical implementation of the circuit design. For example, the constraints 110 can include implementation constraints 124. The implementation constraints 124 can include, for example, timing and/or power constraints for the implementation of the circuit design. In some cases, the implementation constraints 124 may dictate that one or more combinatorial logic functions need to be realized using LUTRAM-type LUTs. During implementation of the circuit design, the physical implementation module 108 may indicate a failure of at least one implementation constraint. The physical implementation module 108 can identify critical path(s) in the implementation (in terms of timing, power, or both) each of which does not meet the implementation constraint(s). The constraint on using only LUT-type lookup tables for combinatorial logic function(s) along one or more identified critical paths can be relaxed such that one or more combinatorial logic functions are realized using LUTRAM-type lookup table(s), allowing the implementation to meet the implementation constraints 124.

Figure 2:
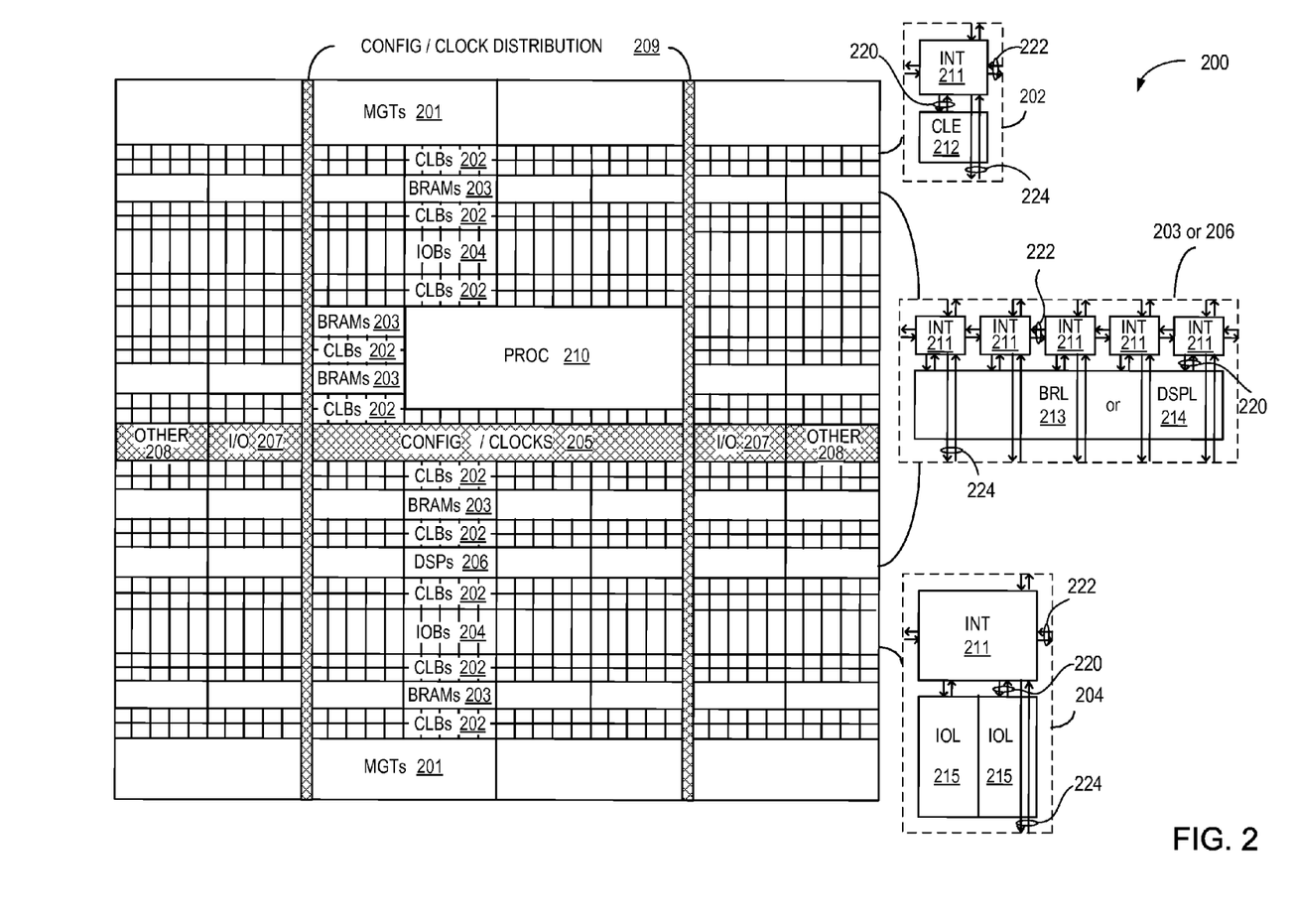
FIG. 2 illustrates an example field programmable gate array (FPGA) architecture.

The circuit design system 100 can be used to implement circuit designs for programmable ICs, such as an FPGA. FIG. 2 illustrates an example architecture of an FPGA 200 having a programmable fabric that includes a large number of different programmable tiles including multi-gigabit transceivers ("MGTs") 201, configurable logic blocks ("CLBs") 202, random access memory blocks ("BRAMs") 203, input/output blocks ("IOBs") 204, configuration and clocking logic ("CONFIG/CLOCKS") 205, digital signal processing blocks ("DSPs") 206, specialized input/output blocks ("I/O") 207 (e.g., configuration ports and clock ports), and other programmable logic 208 such as digital clock managers, analog-to-digital converters, system monitoring logic, and so forth. Some FPGAs also include dedicated processor blocks ("PROC") 210.

In some FPGAs, each programmable tile can include at least one programmable interconnect element ("INT") 211 having connections to input and output terminals 220 of a programmable logic element within the same tile, as shown by examples included at the top of FIG. 2. Each programmable interconnect element 211 can also include connections to interconnect segments 222 of adjacent programmable interconnect element(s) in the same tile or other tile(s). Each programmable interconnect element 211 can also include connections to interconnect segments 224 of general routing resources between logic blocks (not shown). The general routing resources can include routing channels between logic blocks (not shown) comprising tracks of interconnect segments (e.g., interconnect segments 224) and switch blocks (not shown) for connecting interconnect segments. The interconnect segments of the general routing resources (e.g., interconnect segments 224) can span one or more logic blocks. The programmable interconnect elements 211 taken together with the general routing resources implement a programmable interconnect structure ("programmable interconnect") for the illustrated FPGA. Each programmable interconnect element 211 can include an interconnect circuit that can implement various types of switching among input interconnect segments and output interconnect segments, such as cross-point switching, breakpoint switching, multiplexed switching, and the like.

In an example, a CLB 202 can include a configurable logic element ("CLE") 212 that can be programmed to implement user logic plus a single programmable interconnect element ("INT") 211. A BRAM 203 can include a BRAM logic element ("BRL") 213 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 206 can include a DSP logic element ("DSPL") 214 in addition to an appropriate number of programmable interconnect elements. An IOB 204 can include, for example, two instances of an input/output logic element ("IOL") 215 in addition to one instance of the programmable interconnect element 211. As will be clear to those of skill in the art, the actual I/O pads connected, for example, to the I/O logic element 215 typically are not confined to the area of the input/output logic element 215.

In the pictured example, a horizontal area near the center of the die (shown in FIG. 2) is used for configuration, clock, and other control logic. Vertical columns 209 extending from this horizontal area or column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, processor block 210 spans several columns of CLBs and BRAMs. The processor block 210 can various components ranging from a single microprocessor to a complete programmable processing system of microprocessor(s), memory controllers, peripherals, and the like.

Note that FIG. 2 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 2 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. Moreover, the FPGA of FIG. 2 illustrates one example of a programmable IC that can employ examples of the interconnect circuits described herein. The interconnect circuits described herein can be used in other types of programmable ICs, such as complex programmable logic devices (CPLDs) or any type of programmable IC having a programmable interconnect structure for selectively coupling logic elements.

Figure 3:
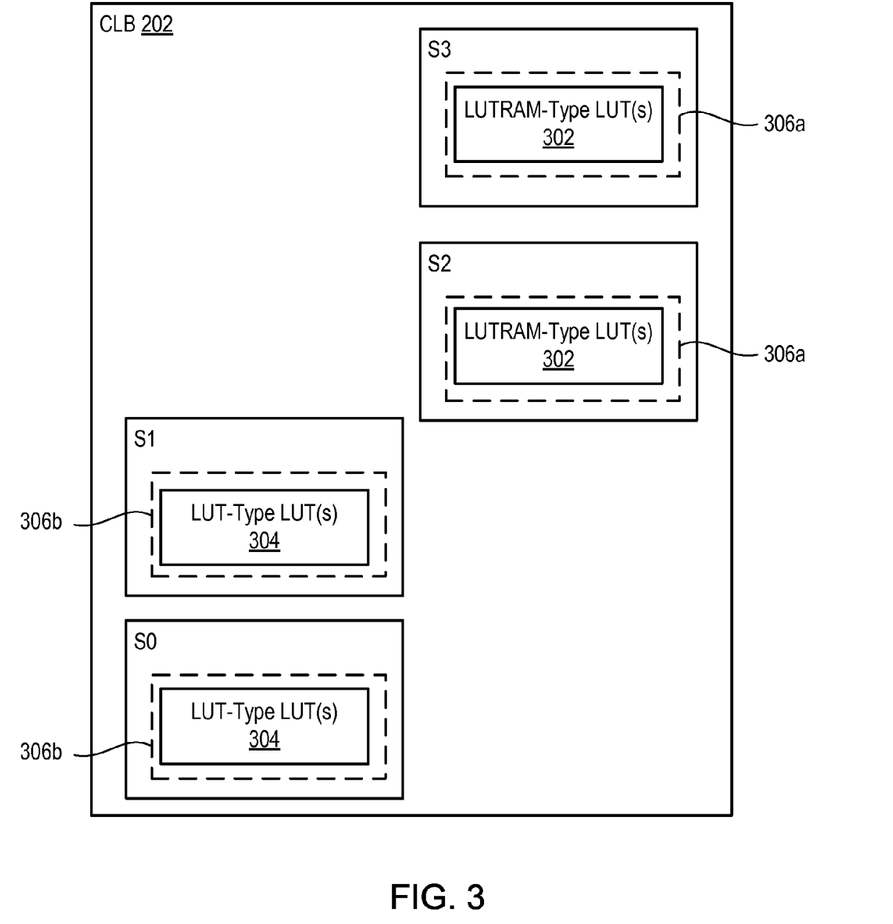
FIG. 3 is a block diagram depicting an example CLB of in the FPGA architecture of FIG. 2.

FIG. 3 is a block diagram depicting an example CLB 202 of the FPGA 200. The CLB 202 includes four slices designated S0, S1, S2, and S4. In other examples, a CLB 202 can have more or less than four slices. Each slice includes at least one LUT. Slices S0 and S1 includes LUT-type lookup tables 304. Slices S2 and S3 include LUTRAM-type lookup tables 302. FIG. 3 shows just one example allocation of LUT-type and LUTRAM-type lookup tables among CLB slices, and other allocations are possible. For example, all slices in the CLB can include LUTRAM-type lookup tables or LUT-type lookup tables. Different CLBs 202 in the FPGA 200 can have different allocations of LUT-type lookup tables and LUTRAM-type lookup tables among CLB slices. As a whole, the FPGA 200 can include any ratio of LUT-type lookup tables to LUTRAM-type look tables (e.g., an even split, more LUT-type lookup tables, or more LUTRAM-type lookup tables). The LUT-type lookup tables 304 are associated with configuration memory cells 306b, and the LUTRAM-type lookup tables 302 are associated with configuration memory cells 306a.

Figure 4A:
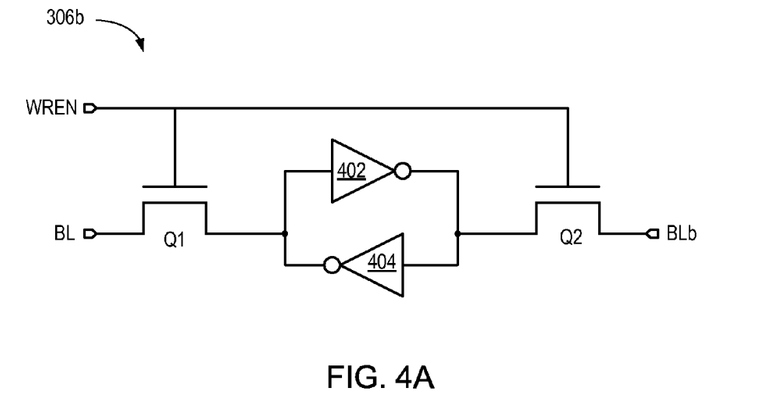
FIG. 4A is a schematic diagram depicting an example configuration memory cell for use with a lookup table-type (LUT-type) lookup table.

FIG. 4A is a schematic diagram depicting an example configuration memory cell 306b for use with a LUT-type lookup table. The configuration memory cell 306b includes a pair of cross-coupled inverters 402 and 404 and a pair of pass-gate transistors Q1 and Q2. Complementary bit-lines BL and BL_b are coupled to drains of the respective transistors Q1 and Q2. A write/read enable (WREN) line is coupled to the gates of the transistors Q1 and Q2. The source of transistor Q1 is coupled to the input of the inverter 402 and the output of the inverter 404. The source of transistor Q2 is coupled to the input of the inverter 404 and the output of the inverter 402. Transistors Q1 and Q2 provide access to complementary bit nodes of the cross-coupled inverters 402 and 404 when an enable signal on the WREN line is asserted.

Figure 4B:
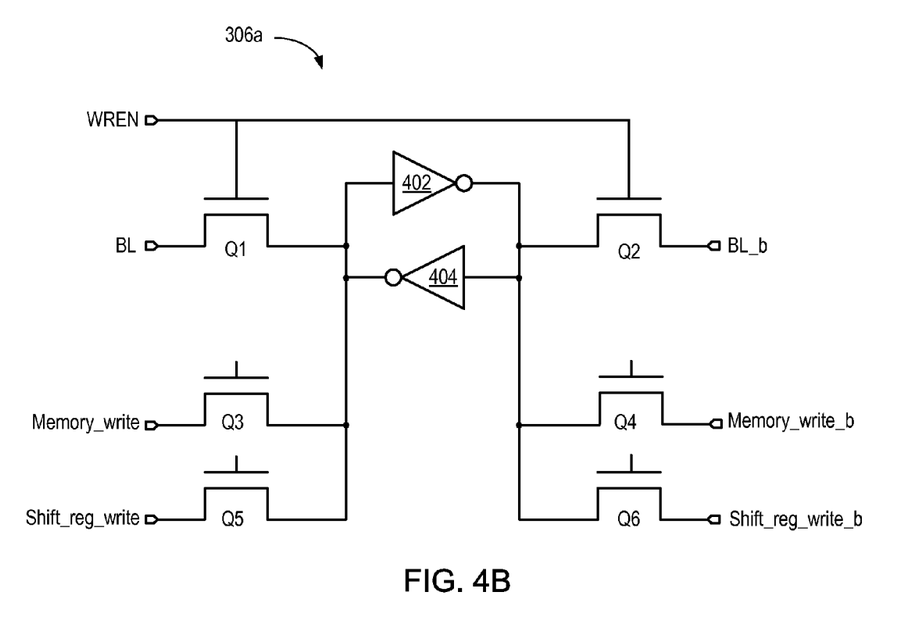
FIG. 4B is a schematic diagram depicting an example configuration memory cell for use with a LUT random access memory-type (LUTRAM-type) lookup table.

FIG. 4B is a schematic diagram depicting an example configuration memory cell 306a for use with a LUTRAM-type lookup table. Elements of the configuration memory cell 306a that are the same as the configuration memory cell 306b are designated with identical reference numerals and discussed above. The configuration memory cell 306a includes four additional pass-gate transistors Q3, Q4, Q5, and Q6. Complementary lines Memory_write and Memory_write_b are coupled to drains of the respective transistors Q3 and Q4. Complementary lines Shift_reg_write and Shift_reg_write_b are coupled to drains of the respective transistors Q5 and Q6. Sources of the transistors Q3 and Q5 are coupled to the input of the inverter 402 and the output of the inverter 404. Sources of the transistors Q4 and Q6 are coupled to the input of the inverter 404 and the output of the inverter 402. Gates of the transistors Q3, Q4, Q4, and Q6 can be coupled to control signals similar to the WREN line (not shown). The transistors Q3 and Q4 provide access to the complementary bit nodes of the cross-coupled inverters 402 and 404 for purposes of writing/reading a LUTRAM. The transistors Q5 and Q6 provide access to the complementary bit nodes of the cross-coupled inverters 402 and 404 for purposes of shifting data in to, or shifting data out of, a LUTRAM.

As shown in FIGS. 4A and 4B, configuration memory cells 306a associated with the LUTRAM-type lookup tables 302 have more transistors than configuration memory cells 306b associated with LUT-type lookup tables 304. In the examples shown, each configuration memory cells 306a includes four more transistors than a configuration memory cell 306b. Other configuration memory cell configurations are possible. In general, a configuration memory cell 306a for a LUTRAM-type lookup table includes more transistors than a configuration memory cell 306b for a LUT-type lookup table in order to provide the increased functionality of the storage mode. Due to the additional transistors in associated configuration memory cells, a LUTRAM-type lookup table is more sensitive to SEU effects than a LUT-type lookup table. In terms of functionality, a LUTRAM-type lookup table can be used to implement a combinatorial logic function in the same manner as a LUT-type lookup table. However, in terms of SEU effects, it is better to use a LUT-type lookup table to implement the combinatorial logic function rather than the LUTRAM-type lookup table. Of course, LUTRAM-type lookup tables have the additional functionality of the storage mode in order to implement storage-type logic functions (e.g., RAM, shift register, etc.) that cannot be implemented using only LUT-type lookup tables.

Figure 5:
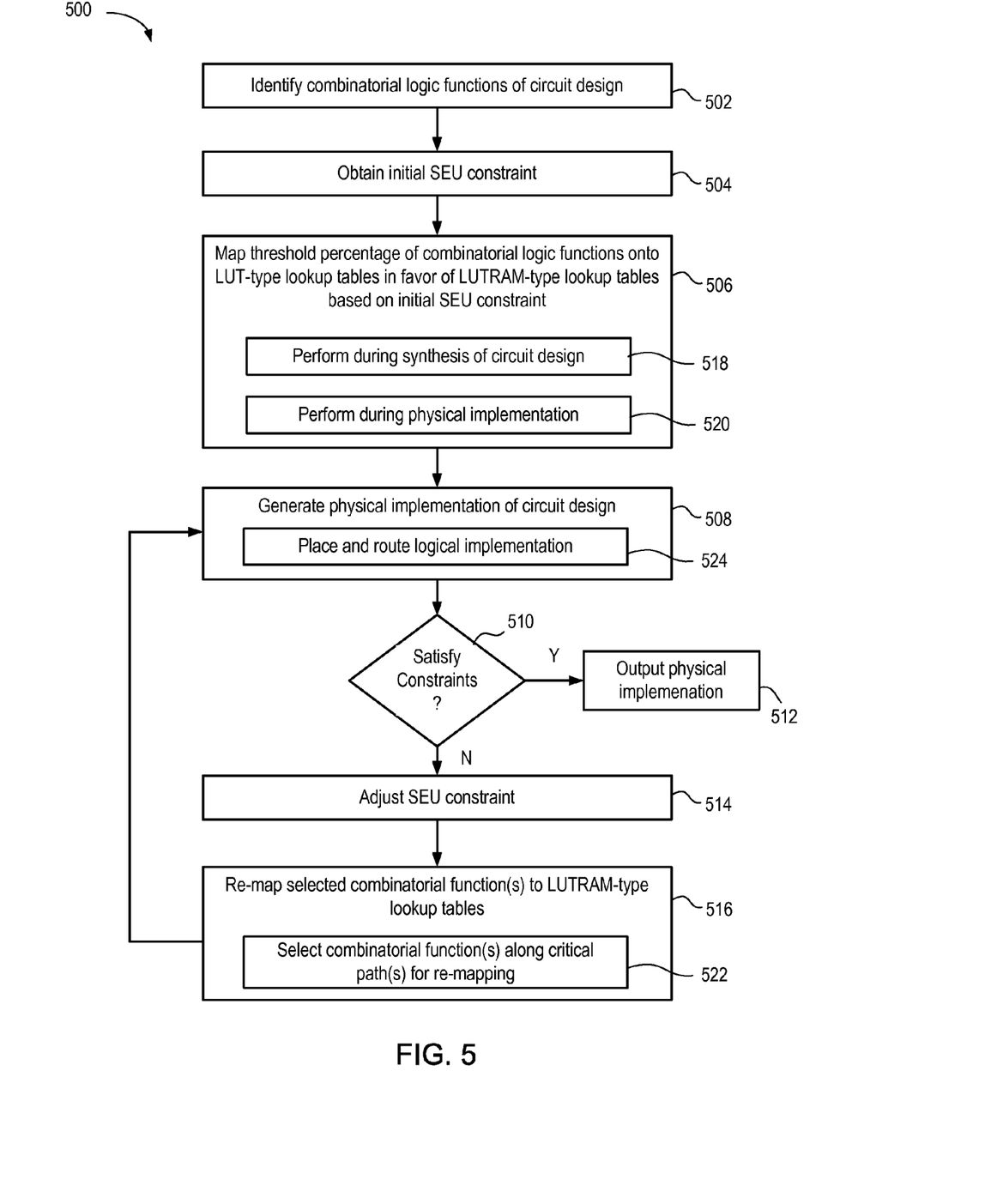
FIG. 5 is a flow diagram depicting an example method of implementing a circuit design for a programmable IC.

FIG. 5 is a flow diagram depicting an example method 500 of implementing a circuit design for a programmable IC. The method 500 can be performed by the circuit design system 100 of FIG. 1. The method 500 begins at step 502, where the circuit design system 100 identifies combinatorial logic functions of an input circuit design. For example, a user can input a circuit design through the design entry module 104 and then request implementation of the circuit design for a target programmable IC. In response to the implementation request, the circuit design system 100 can identify combinatorial logic functions in the circuit design that need to be mapped to LUTs of the target programmable IC.

At step 504, the circuit design system 100 obtains an initial SEU constraint for the circuit design. The initial SEU constraint defines the percentage of the identified combinatorial logic functions that are constrained to being realized using LUT-type lookup tables, rather than LUTRAM-type lookup tables. In an example, the initial SEU constraint specifies that all (100%) of the identified combinatorial logic functions are to be realized using LUT-type lookup tables. In other examples, some percentage of the identified combinatorial logic functions is allowed to be realized using LUTRAM-type lookup tables. The initial SEU constraint can be defined by the user, or selected from default SEU constraint(s).

At step 506, the circuit design system 100 maps a threshold percentage of combinatorial logic functions onto LUT-type lookup tables in favor of LUTRAM-type lookup tables based on the initial SEU constraint. At step 518, the circuit design system 100 can perform step 506 during synthesis of the circuit design (e.g., by the synthesis module 106). Alternatively, at step 520, the circuit design system 100 can perform step 506 during physical implementation of the circuit design (e.g., by the physical implementation module 108).

At step 508, the circuit design system 100 generates a physical implementation of the circuit design (e.g., the circuit design is mapped, placed, and routed for a target FPGA). For example, the circuit design system 100 can place and route a logical implementation of the circuit design (step 524). At step 510, the circuit design system 100 determines whether the physical implementation satisfies defined implementation constraints (e.g., power and/or timing constraints). If so, the method 500 proceeds to step 512, where the circuit design system 100 outputs the physical implementation of the circuit design. If not, the method 500 proceeds to step 514.

At step 514, the circuit design system 100 adjusts the SEU constraint. The circuit design system 100 can adjust the SEU constraint to allow for more of the combinatorial logic functions to be implemented using LUTRAM-type lookup tables than the initial SEU constraint. In one example, the SEU constraint can be loosened and the combinatorial logic functions can be re-mapped to LUTs based on the new SEU constraint. In another example, the SEU constraint can be loosened for particular combinatorial logic function(s) that are the cause of constraint failure in step 510. For example, one or more combinatorial logic functions can be located along critical path(s) of the circuit design. By forcing such combinatorial logic function(s) to be implemented using LUT-type lookup tables, the particular placement and routing generated in step 508 may be sub-optimal. The SEU constraint can be loosened for such combinatorial logic functions to improve the placement and routing of the circuit design.

At step 516, the circuit design system 100 re-maps selected combinatorial logic function(s) to LUTRAM-type lookup tables. For example, at step 522, the circuit design system 100 can selected combinatorial logic function(s) along critical path(s) for re-mapping. The method 500 returns to step 508 to generate another physical implementation. If implementation constraints are satisfied, the method 500 ends by outputting a physical implementation at step 512. Otherwise, the circuit design system 100 performs further re-mapping and repeats.

Figure 6:
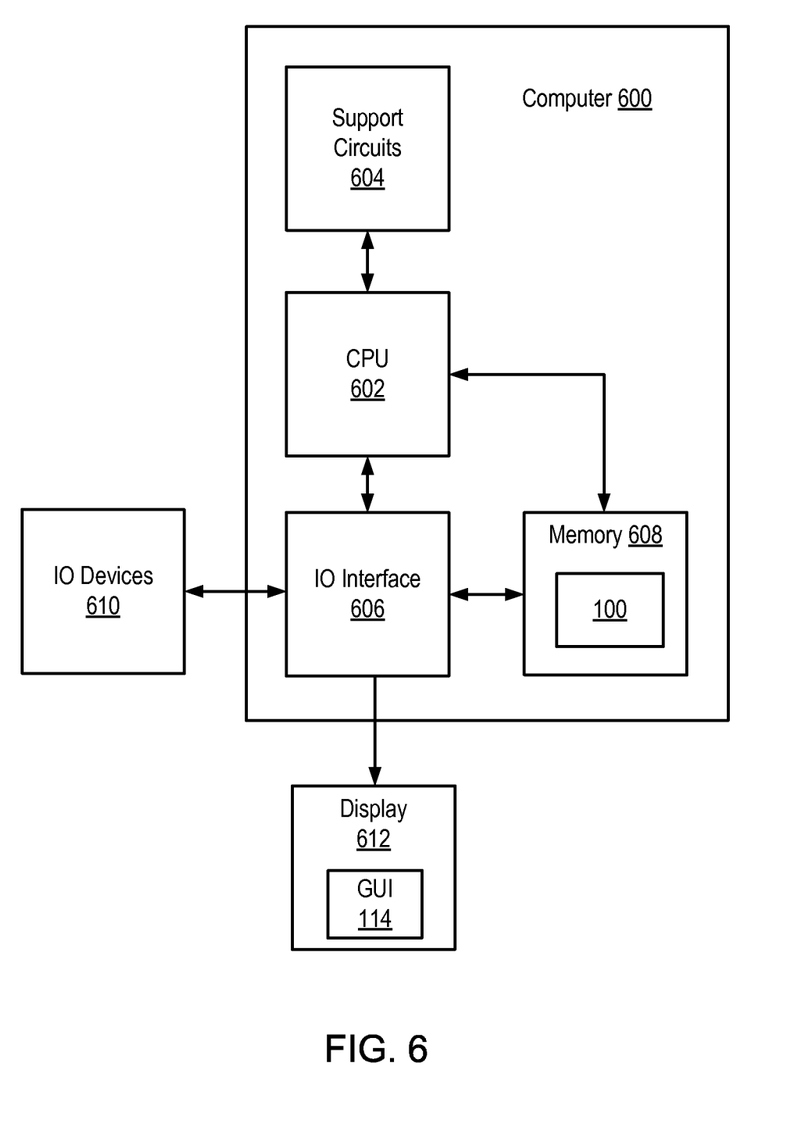
FIG. 6 is a block diagram depicting a computer suitable for implementing the methods and systems described herein.

FIG. 6 is a block diagram depicting a computer 600 suitable for implementing the methods and systems described herein. The computer 600 includes a central processing unit (CPU) 602, a memory 608, various support circuits 604, and an IO interface 606. The CPU 602 can include one or more microprocessors. The support circuits 604 can include conventional cache, power supplies, clock circuits, data registers, IO interfaces, and the like. The IO interface 606 may be directly coupled to the memory 608 or coupled through the CPU 602. The IO interface 606 can be coupled to various IO devices 610, such as conventional keyboard, mouse, printer, and the like, as well as a display 612. The display 612 can be used to present a GUI, such as the GUI 114.

The memory 608 may store all or portions of one or more programs and/or data to implement the systems and methods described herein. For example, the memory 608 can store programs for implementing the circuit design system 100 of FIG. 1. The memory 608 can include one or more of random access memory (RAM), read only memory (ROM), magnetic read/write memory, and the like.

The various examples described herein may employ various computer-implemented operations involving data stored in computer systems. For example, these operations may require physical manipulation of physical quantities—usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more example implementations may be useful machine operations. In addition, one or more examples also relate to a device or an apparatus for performing these operations. The apparatus may be specially constructed for specific required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various examples described herein may be practiced with other computer system configurations including handheld devices, microprocessor systems, microprocessor-based or programmable consumer electronics, minicomputers, mainframe computers, and the like.

One or more examples may be implemented as one or more computer programs or as one or more computer program modules embodied in one or more computer readable media. The term computer readable medium refers to any data storage device that can store data which can thereafter be input to a computer system—computer readable media may be based on any existing or subsequently developed technology for embodying computer programs in a manner that enables them to be read by a computer. Examples of a computer readable medium include a hard drive, network attached storage (NAS), read-only memory, random-access memory (e.g., a flash memory device), a Compact Disc (CD)-ROM, a CD-R, or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

While the foregoing is directed to specific examples, other and further examples may be devised without departing from the basic scope thereof, and the scope thereof is determined by the claims that follow.

What is claimed is:

1. A method of implementing a circuit design for a programmable integrated circuit (IC), comprising:
   identifying combinatorial logic functions of the circuit design;
   mapping, according to a first constraint, a first threshold percentage of the combinatorial logic functions onto a first type of lookup tables (LUTs) of the programmable IC in favor of second type of LUTs of the programmable IC, the second type of LUTs being more susceptible to single event upsets than the first type of LUTs; and
   generating a first physical implementation of the circuit design for the programmable IC based on the mapping.

2. The method of claim 1, wherein the first type of LUTs are controlled by first configuration memory cells having less transistors than second configuration memory cells controlling the second type of LUTs.

3. The method of claim 1, wherein the first type of LUTs have only a combinatorial mode and the second type of LUTs have both a combinatorial mode and a storage mode.

4. The method of claim 1, wherein the first threshold percentage of the combinatorial logic functions comprises all of the combinatorial logic functions.

5. The method of claim 1, wherein the mapping is performed during a process of synthesizing a functional description of the circuit design.

6. The method of claim 1, wherein the mapping is performed during a process of physically implementing a logical implementation of the circuit design.

7. The method of claim 1, wherein the generating the first physical implementation comprises:
   placing and routing a logical implementation of the circuit design within a programmable fabric of the programmable IC.

8. The method of claim 1, further comprising:
   determining that the first physical implementation fails at least one implementation constraint;
   re-mapping at least one selected combinatorial logic function from the first type of LUTs to the second type of LUTs; and
   generating a second physical implementation of the circuit design for the programmable IC based on the re-mapping.

9. The method of claim 8, wherein the at least one selected combinatorial logic function is along at least one critical path of the circuit design.

10. A non-transitory computer readable medium comprising instructions, which when executed in a computer system, causes the computer system to carry out a method of implementing a circuit design for a programmable integrated circuit (IC), comprising:
    identifying combinatorial logic functions of the circuit design;
    mapping, according to a first constraint, a first threshold percentage of the combinatorial logic functions onto a first type of lookup tables (LUTs) of the programmable IC in favor of second type of LUTs of the programmable IC, the second type of LUTs being more susceptible to single event upsets than the first type of LUTs; and
    generating a first physical implementation of the circuit design for the programmable IC based on the mapping.

11. The non-transitory computer readable medium of claim 10, wherein the first type of LUTs are controlled by first configuration memory cells having less transistors than second configuration memory cells controlling the second type of LUTs.

12. The non-transitory computer readable medium of claim 10, wherein the first type of LUTs have only a combinatorial mode and the second type of LUTs have both a combinatorial mode and a storage mode.

13. The non-transitory computer readable medium of claim 10, wherein the first threshold percentage of the combinatorial logic functions comprises all of the combinatorial logic functions.

14. The non-transitory computer readable medium of claim 10, further comprising:
    determining that the first physical implementation fails at least one implementation constraint;
    re-mapping at least one selected combinatorial logic function from the first type of LUTs to the second type of LUTs; and
    generating a second physical implementation of the circuit design for the programmable IC based on the re-mapping.

15. A computer system including a circuit design tool executing therein programmed to implement a circuit design for a programmable integrated circuit (IC), comprising:
    a memory coupled to store descriptions of the circuit design; and
    a processor, coupled to the memory, programmed to:
       identify combinatorial logic functions of the circuit design;
       map, according to a first constraint, a first threshold percentage of the combinatorial logic functions onto a first type of lookup tables (LUTs) of the programmable IC in favor of second type of LUTs of the programmable IC, the second type of LUTs being more susceptible to single event upsets than the first type of LUTs; and
       generate a first physical implementation of the circuit design for the programmable IC.

16. The computer system of claim 15, wherein the first type of LUTs are controlled by first configuration memory cells having less transistors than second configuration memory cells controlling the second type of LUTs.

17. The computer system of claim 15, wherein the first type of LUTs have only a combinatorial mode and the second type of LUTs have both a combinatorial mode and a storage mode.

18. The computer system of claim 15, wherein the first threshold percentage of the combinatorial logic functions comprises all of the combinatorial logic functions.

19. The computer system of claim 15, wherein the processor is further programmed to:
    determine that the first physical implementation fails at least one implementation constraint;
    re-map at least one selected combinatorial logic function from the first type of LUTs to the second type of LUTs; and
    generate a second physical implementation of the circuit design for the programmable IC based on the re-mapping.

20. The computer system of claim 19, wherein the at least one selected combinatorial logic function is along at least one critical path of the circuit design.

* * * * *